United States Patent
Kim (10) Patent No.: US 7,471,143 B2
(45) Date of Patent: Dec. 30, 2008

(54) APPARATUS AND METHOD FOR ADAPTIVE DEMODULATION OF PWM SIGNAL

(75) Inventor: Eui-Seung Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 129 days.

(21) Appl. No.: 11/636,187

(22) Filed: Dec. 8, 2006

(65) Prior Publication Data

US 2007/0176706 A1    Aug. 2, 2007

(30) Foreign Application Priority Data

Jan. 27, 2006   (KR)   .................... 10-2006-0008676

(51) Int. Cl.
*H03K 9/08* (2006.01)
(52) U.S. Cl. ...................... 329/312; 375/340
(58) Field of Classification Search ................ 329/312; 332/109; 375/238, 340
See application file for complete search history.

(56) References Cited

U.S. PATENT DOCUMENTS

| 4,250,464 A | * | 2/1981 | Schade, Jr. .................. 331/65 |
| 4,507,625 A |   | 3/1985 | Lee et al. ...................... 332/31 |
| 4,644,300 A | * | 2/1987 | Ibe et al. ...................... 331/111 |
| 5,502,419 A | * | 3/1996 | Kawasaki et al. ........... 332/109 |
| 5,870,000 A | * | 2/1999 | Matsuda et al. ............... 331/34 |

OTHER PUBLICATIONS

Korean Patent Application No. 1020030036580 to Shin, having Publication date of Dec. 16, 2004 (w/ English Abstract page).
Japanese Patent Application No. 04-307208 to Toru, having Publication date of Jun. 10, 1994 (w/ English Abstract page).
Japese Patent Application No. 10-353813 to Teruo, having Publication date of Jun. 16, 2000 (w/ English Abstract page).

* cited by examiner

*Primary Examiner*—Benny Lee
*Assistant Examiner*—Levi Gannon
(74) *Attorney, Agent, or Firm*—Monica H. Choi (57) ABSTRACT

A demodulator for processing a PWM (pulse width modulation) signal includes a variable capacitor, a charging unit, a discharging unit, and a tuner. The charging and discharging units charge or discharge the variable capacitor depending on the PWM signal. The tuner determines a capacitance of the variable capacitor and a discharge current of the discharging unit for proper operation of the demodulator in various RF environments.

20 Claims, 8 Drawing Sheets

Fig. 1

(PRIOR ART)

APPARATUS AND METHOD FOR ADAPTIVE DEMODULATION OF PWM SIGNAL

BACKGROUND OF THE INVENTION

This application claims priority under 35 U.S.C. § 119 to Korean Patent Application No. 2006-08676, filed on Jan. 27, 2006 in the Korean Intellectual Property Office, the disclosure of which is incorporated herein in its entirety by reference.

1. Field of the Invention

The present invention relates generally to communication systems, and more particularly, to adaptive demodulation of a PWM signal by adjusting capacitance and discharge current in a delay filter.

2. Background of the Invention

In general, radio frequency identification (RFID) transponders or RFID tags began to be studied for identifying livestock early in the United States of America. Demand for RFID systems have increased for other applications such as using an RFID tag for a smart card (chip card or integrated circuit card) for providing convenience and security.

For example, unauthorized access to personal information in smart cards used as credit or financial cards is desired to be prevented. As technology for forging and hacking such private cards improves, the conventional magnetic card is desired to be changed to a chip card (or IC card) especially for use as financial cards. Application of RFID tags is extending even to pricing models and logistics systems in contact with mobile communication systems, as well as to smart card systems.

For contact-less smart cards, the RFID tag embeds identification codes that are internally recognizable. When a reader deciphering such codes sends an RF signal to the RFID tag, the identification codes stored in the tag are transferred to the reader by way of a modulator comprised in the tag. The RFID tags for the contact-less smart cards use power from current induced at coils by RF signals from the reader.

One of general communication modes is pulse-width modulation (PWM) that transforms binary data into patterns of pulse width. For instance, in an RFID tag operable in 900 MHz, when a pulse width of a received signal is ⅛ of a pulse period $T_0$, the received signal is demodulated into a logic low level [0]. Otherwise, when the pulse width is ⅜ of the pulse period $T_0$, the received signal is demodulated into a logic high level [1]. For such demodulation, the RFID tag includes a demodulator operating with delay filtering.

Figure 1:
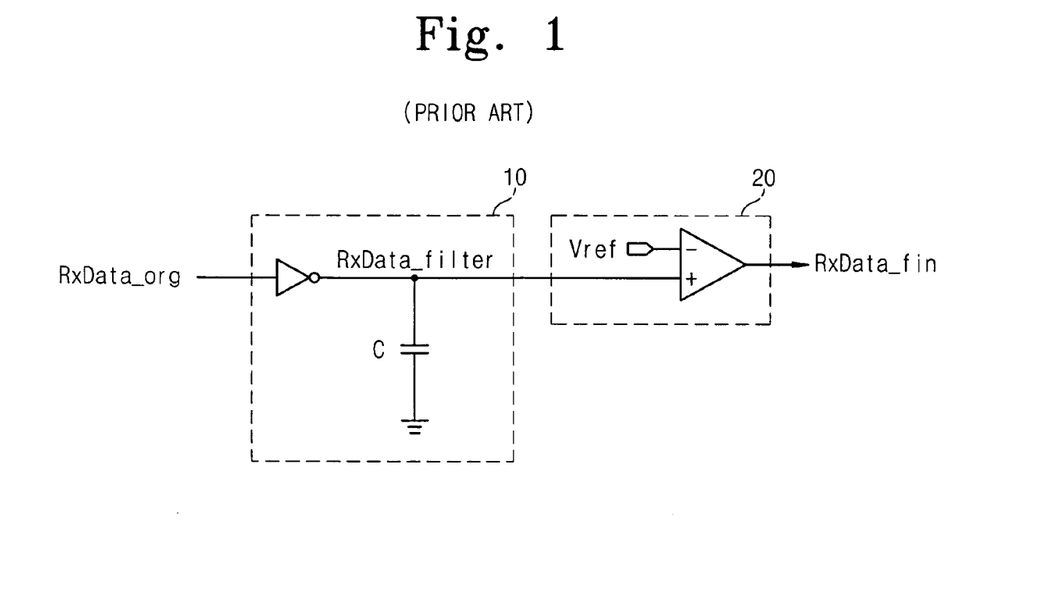
FIG. 1 is a circuit diagram of a PWM demodulator of a delay filtering type, according to the prior art.

FIG. 1 is a circuit diagram of a conventional PWM demodulator with delay filtering in a smart card. Referring to FIG. 1, the PWM demodulator receives and inverts a PWM (pulse width modulation) signal to generate an inverted PWM signal RxData_filter. The inverted PWM signal RxData_filter charges or discharges a capacitor C having a fixed capacitance. The inverted PWM signal RxData_filter that is at the logic high level [1] charges the capacitor C, and that is at the logic low level [0] discharges the capacitor C.

The PWM demodulator of FIG. 1 includes a comparator 20 that generates a high logic level [1] when the voltage at the capacitor C is charged to higher than a reference voltage Vref. Thus, when the received PWM signal RxData_org has a period with the logic low level for (⅜)$T_0$, the comparator 20 outputs the logic high level [1]. When the received PWM signal RxData_org has a period with the logic low level for (⅛)$T_0$, the comparator 20 outputs the logic low level [0]. Thus, the comparator 20 generates digital output RxData_fin.

Figure 2A:
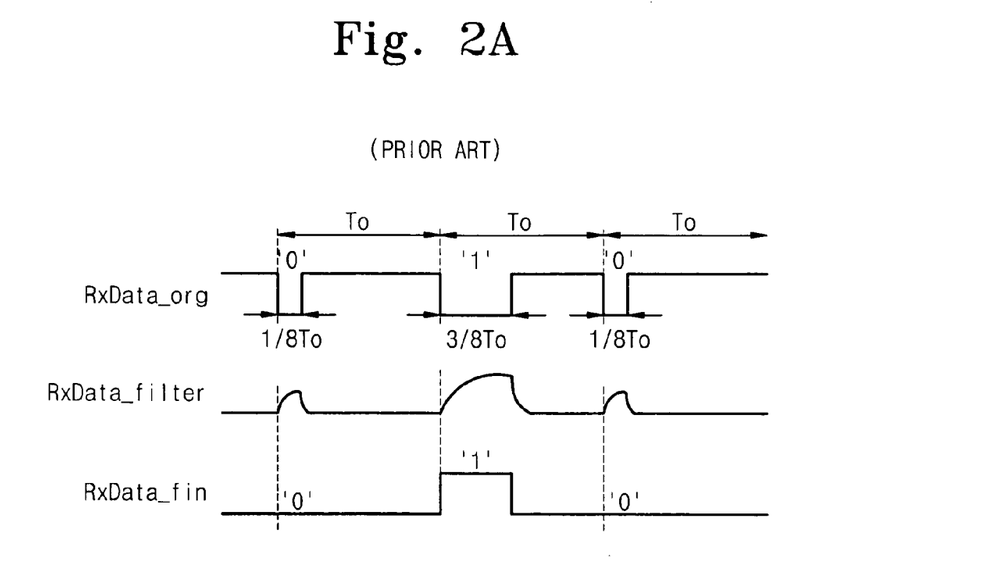
FIG. 2A shows a timing diagram of signals during operation of the PWM demodulator of FIG. 1, according to the prior art.

FIG. 2A shows timing diagrams of such example signals RxData_org, RxData_filter, and RxData_fin during operation of the PWM demodulator of FIG. 1.

Figure 2B:
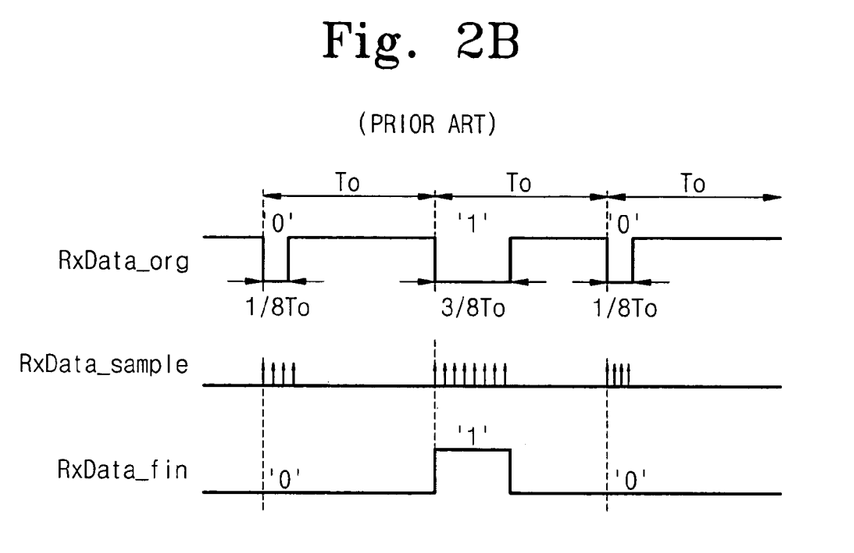
FIG. 2B shows a timing diagram of signals during a PWM demodulator using sampling with an internal oscillator, according to the prior art.

FIG. 2B shows timing diagrams of signals during operation of a PWM demodulator that samples the received PWM signal RxData_org using a clock signal generated by an internal oscillator, in contrast to the delay-filtering type PWM demodulator of FIG. 1. In that case, the inverted PWM signal is output as sampled pulses RxData_sample. Such sampled pulses RxData_sample may be counted for generating the binary output RxData_fin.

Unfortunately, the internal oscillator used in such a PWM demodulator increases power consumption and causes fluctuation of internal power supply. Such a fluctuation results in instability of the sampling frequency, and thus in inaccurate demodulation of the PWM signal. Therefore, the delay-filtering type PWM demodulator is desired in a contact-less RFID tag.

However, the delay-filtering PWM demodulator of FIG. 1 uses the capacitor C having a fixed capacitance. The capacitance of the capacitor C may not be predictable because of process variations during fabrication of the delay-filtering PWM demodulator of FIG. 1 as an integrated circuit. Furthermore, the delay-filtering PWM demodulator of FIG. 1 using the fixed capacitor C may not operate properly in various RF environments with variation of the reader and fluctuation of power transmitted through RF.

SUMMARY OF THE INVENTION

Accordingly, an adaptive PWM demodulator of the delay-filtering type is desired for operating properly in various RF environments.

A demodulator for processing a PWM (pulse width modulation) signal according to an aspect of the present invention includes a variable capacitor, a charging unit, a discharging unit, a sampler, and a tuner. The charging unit charges the variable capacitor when the PWM signal is at a first logic level, and the discharging unit discharges the variable capacitor when the PWM signal is at a second logic level. The sampler generates a sampled data from a voltage at the variable capacitor. The tuner determines a final capacitance of the variable capacitor and a final discharge current of the discharging unit resulting in the sampled data having a desired bit pattern.

In an example embodiment of the present invention, the charging unit includes a transistor that is turned on for coupling a high supply voltage to the variable capacitor when the PWM signal is at the first logic level.

In another embodiment of the present invention, the discharging unit includes a plurality of transistors. A set of such transistors is selected by the tuner to be turned on for coupling a low supply voltage to the variable capacitor when the PWM signal is at the second logic level.

In a further embodiment of the present invention, the variable capacitor includes a plurality of capacitors. A set of such capacitors is selected by the tuner to be coupled to the charging and discharging units.

In another embodiment of the present invention, the sampler generates the sampled data in sync with the PWM signal.

In a further embodiment of the present invention, the demodulator further includes a data holder for storing and outputting the sampled data from the sampler when the tuner indicates that sampled data has the desired bit pattern.

In another embodiment of the present invention, the tuner adjusts a capacitance of the variable capacitor and a discharge current of the discharging unit until the sampled data has the desired bit pattern during a clock synchronization period.

In a further embodiment of the present invention, the tuner includes a data processor and a memory device having sequences of instructions stored thereon. Execution of the sequences of instructions by the data processor causes the data processor to perform the steps of:

determining the final capacitance with a maximum discharge current and a minimum discharge current;

determining an interim discharge current that is one half of a threshold discharge current when the sampled data reaches an undesired bit pattern; and verifying the interim discharge current as the final discharge current.

In this manner, because the capacitance and the discharge current are adaptively adjusted, the PWM demodulator may operate properly for various RF environments and even when characteristics of the components of the PWM demodulator vary from fabrication process variations.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2A, 2B, 3, 4A, 4B, 5, 6A, 6B, 7, and 8 refer to elements having similar structure and/or function.

DETAILED DESCRIPTION OF THE INVENTION

Figure 3:
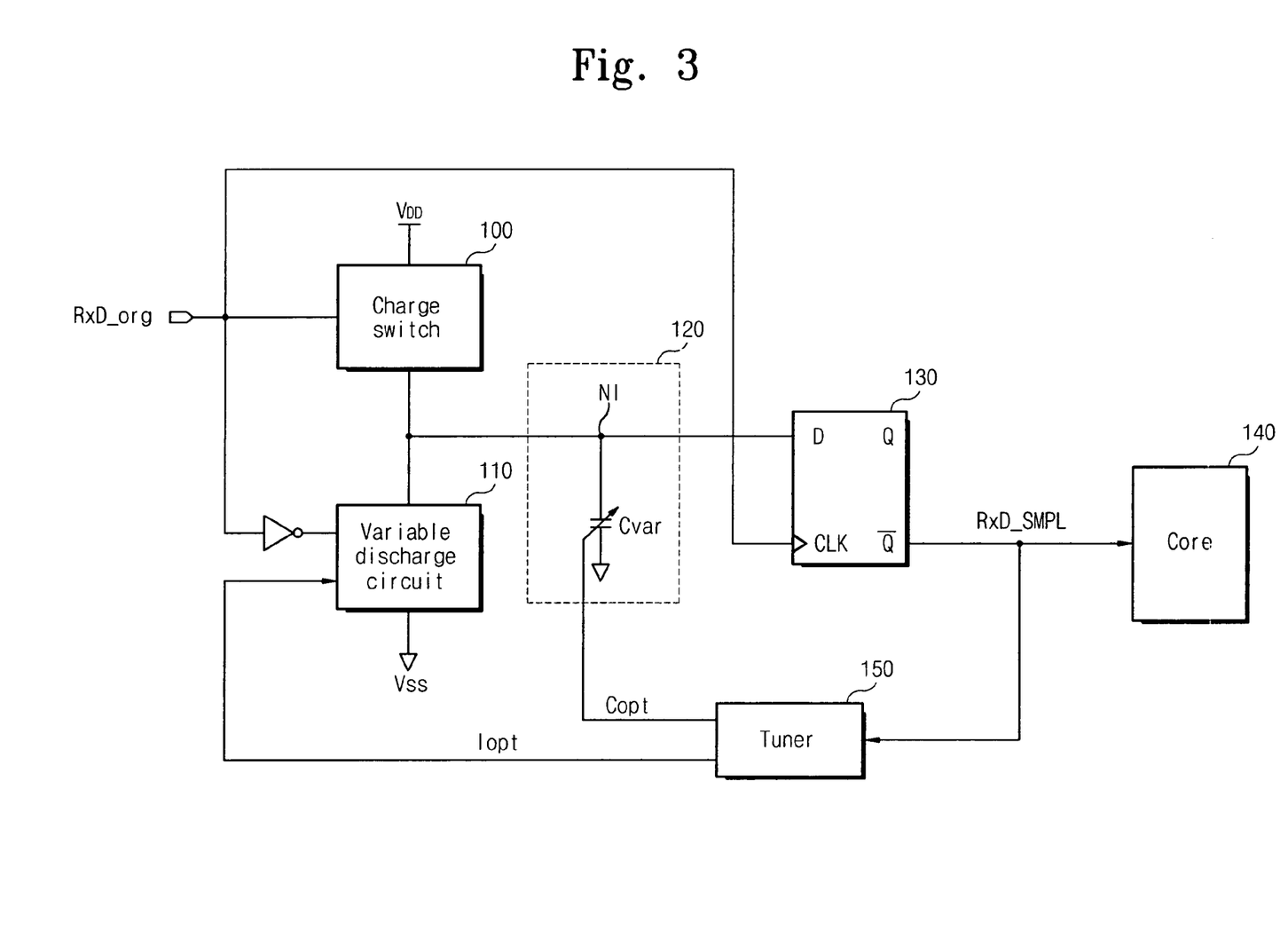
FIG. 3 is a block diagram of an adaptive PWM demodulator, according to an embodiment of the present invention.

FIG. 3 is a block diagram of an adaptive PWM (pulse width modulation) demodulator according to an example embodiment of the present invention. Referring to FIG. 3, the PWM demodulator with delay filtering, according to the present invention, is tuned for operation in various RF environments during a clock sync (CLK_SYNC) period before data is transceived.

The adaptive PWM demodulator includes a charging unit 100 which is a charge switch in one embodiment of the present invention, and includes a discharging unit 110 that is a variable discharge circuit in one embodiment of the present invention. The adaptive PWM demodulator also includes a charge circuit 120 with a variable capacitor Cvar having a terminal coupled to a node N1. The other terminal of the variable capacitor Cvar is coupled to a low supply voltage which may be a ground node.

The charge switch 100 turns on to couple a high supply voltage $V_{DD}$ to the variable capacitor Cvar for charging the node N1 when a received PWM (Pulse Width Modulation) signal RxD_org is at the logic high level. The charge switch 100 is turned off when the received PWM signal RxD_org is at the logic low level. The charge switch 100 is implemented with a switching element such a MOSFET (Metal Oxide Semiconductor Field Effect Transistor) in one embodiment of the present invention.

The variable discharge circuit i 110 operates in response to an inverted form of the received PWM signal RxD_org. The variable discharge circuit 110 turns on to couple a low supply voltage $V_{SS}$ which may be the ground node to the variable capacitor Cvar for discharging the node N1 when the received PWM signal RxD_org is at the logic low level.

The variable discharge circuit 110 discharges the node N1 with a discharge current that is set by a tuner 150 of the adaptive PWM demodulator. The capacitance of the variable capacitor Cvar is also set by the tuner 150. Such tuning of the capacitance of the variable capacitor Cvar and the discharge current of the variable discharge circuit 110 is described in more detail later herein.

The adaptive PWM demodulator further includes a sampler 130 that generates a sampled data RxD_SMPL from a voltage at the node N1. The sampler 130 operates similar to a delay flip flop clocked with rising edges of the received PWM signal RxD_org. The sampled data RxD_org is set to the logic low or high level from comparison of the voltage at the node N1 with a reference voltage at a rising edge of the received PWM signal RxD_org.

The sampled data RxD_SMPL is transferred to a core 140 via a data input/output terminal I/O of a RFID (radio frequency identification) tag. The core 140 receives the sampled data RxD_SMPL for further configuration of internal operations in the RFID tag.

In addition, the tuner 150 determines the capacitance of the variable capacitor Cvar and the discharge current of the variable discharge circuit 110 from the sampled data RxD_SMPL, during a clock sync period. The clock sync period is a time duration when the received PWM signal has a predetermined logic level such as the low logic level [0] for a predetermined number of clock cycles such as for 20 clock cycles for example.

Figure 7:
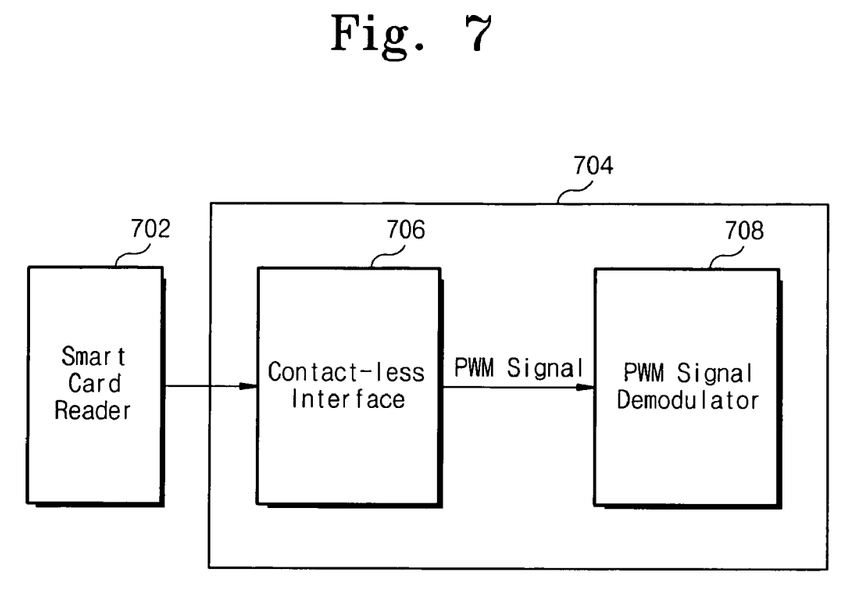
FIG. 7 shows a block diagram of a smart card having the adaptive PWM demodulator of FIG. 3 or 5, according to an embodiment of the present invention.

FIG. 7 illustrates a PWM signal demodulator 708 which may be the PWM signal demodulator of FIG. 3 being within a smart card 704. In that case, a contact-less interface 706 receives the PWM signal transmitted from a smart card reader 702. The contact-less interface 706 includes an antenna for generating the PWM signal from the RF signal sent by the smart card reader 702.

The clock sync period occurs during initialization for achieving mutual synchronization between the RFID tag of the smart card 704 having the PWM signal demodulator 708 and the smart card reader 706, before transceiving data therebetween. The tuner 150 generates a capacitance control signal Copt for setting the capacitance of the variable capacitor Cvar, and generates a current control signal Iopt for setting the discharge current in the variable discharge circuit 110.

During the clock sync period, the tuner 150 determines a final capacitance of the variable capacitor Cvar and a final discharge current of the variable discharge circuit 110 that result in a stable output of the logic low level [0] in the sampled data RxD_SMPL.

Figure 4A:
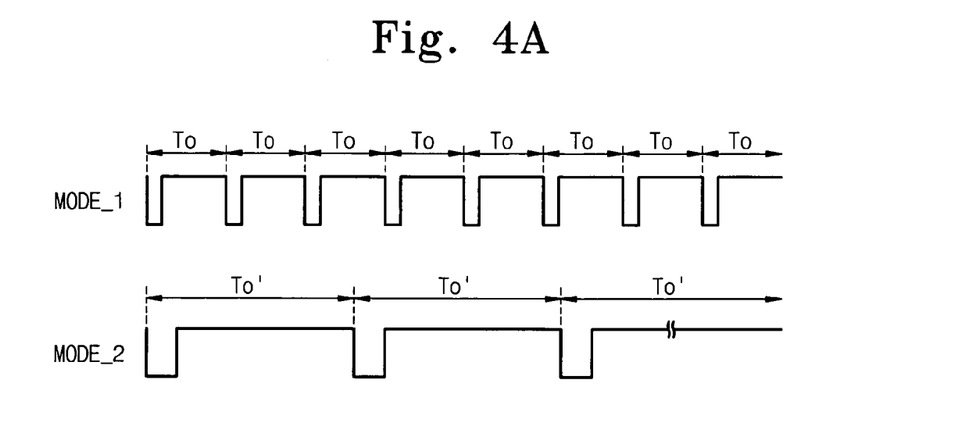
FIG. 4A shows signal waveforms of PWM signals of different operation modes.

FIG. 4A shows timing diagrams of example PWM signals during the clock sync period for two different modes, i.e., the American and European modes, having different clock cycle periods, $T_0$ and $T_0'$. The American mode has a clock cycle period $T_0$ of about 14.25 μs, and the European mode has a clock cycle $T_0'$ of about 65.52 μs with a relatively lower magnitude. The adaptive PWM demodulator of FIG. 3 operates properly for both of such American and European modes when the tuner 150 adjusts the capacitance of the variable capacitor Cvar and the discharge current of the variable discharge circuit 110 for the PWM signals of such different modes.

Figure 4B:
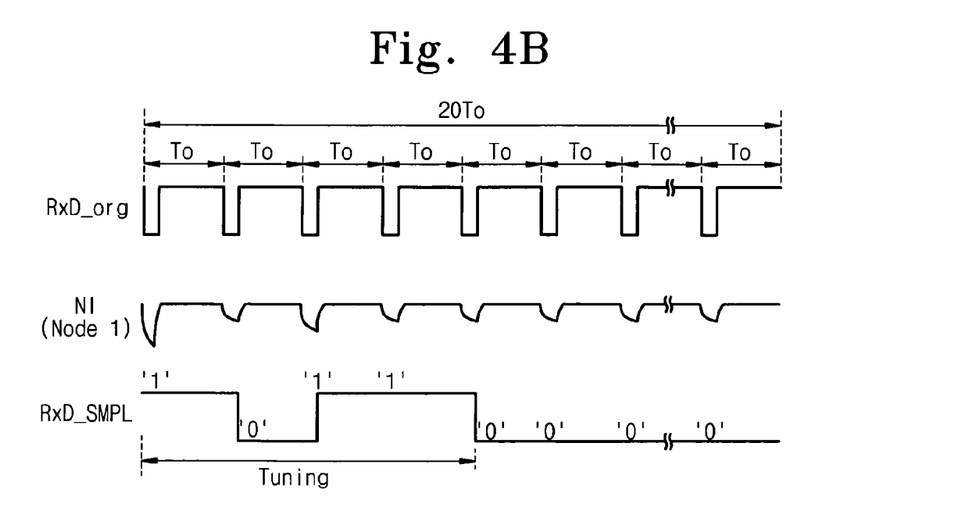
FIG. 4B shows a timing diagram of signals during operation of the adaptive PWM demodulator of FIG. 3, according to an example embodiment of the present invention.

FIG. 4B shows a timing diagram of signals during operation of the PWM demodulator of FIG. 3. The reader 702 sends the PWM signal representing the logic low level [0] for 20 clock cycles $20T_0$ during the clock sync period. For the clock sync operation, the reader sequentially transmits data bits of [0] during the 20 clock cycles. Accordingly, the received PWM signal RxD_org has 20 clock cycles, each with a pulse width of $(1/8)T_0$ to the logic low level.

Further referring to FIG. 4B, the voltage at the node N1 is discharged during such pulse width $(1/8)T_0$, and is charged when the received PWM signal RxD_org is at the logic high level. The tuner 150 adjusts the capacitance of the variable capacitor Cvar and the discharge current of the variable discharge circuit 110 until the sampled data RxD_SMPL reaches a stable output of the logic low level [0].

Figure 5:
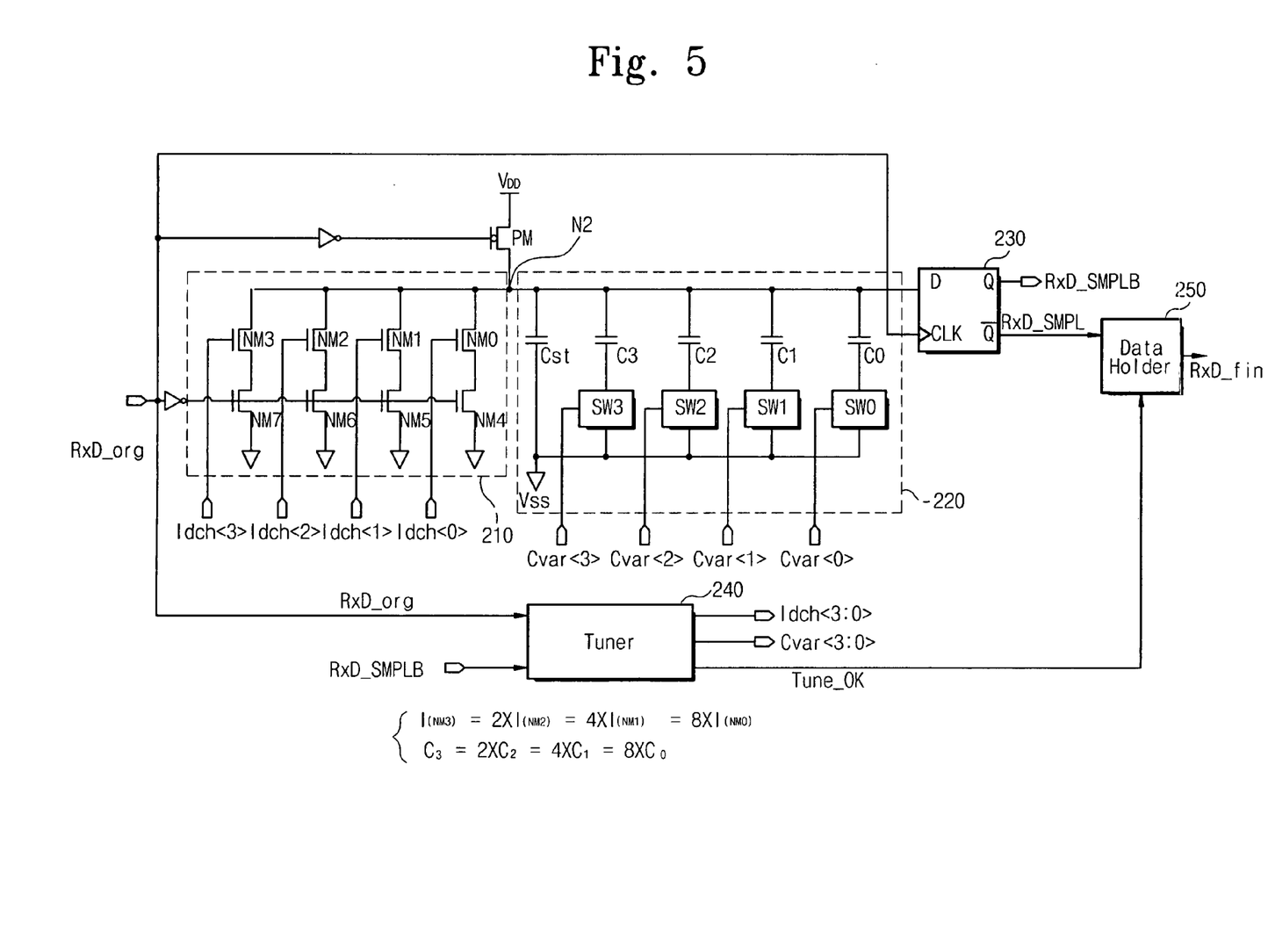
FIG. 5 is a circuit diagram of another adaptive PWM demodulator, according to an embodiment of the present invention.

FIG. 5 shows a circuit diagram for an adaptive PWM demodulator, according to another embodiment of the present invention. Referring to FIG. 5, the PWM demodulator includes a variable discharge circuit 210 comprised of a plurality of NMOSFETs (N-channel metal oxide semiconductor field effect transistors), NM0, NM1, NM2, NM3, NM4, NM5, NM6, and NM7. The PWM demodulator of FIG. 5 also includes a variable capacitor circuit 220 having a static capacitor Cst and a plurality of switched capacitors $C_0$, $C_1$, $C_2$, and $C_3$. The PWM demodulator of FIG. 5 also includes a tuner 240 for controlling the variable discharge circuit 210 and the variable capacitor circuit 220, both coupled to a node N2.

The PWM demodulator of FIG. 5 further includes a PMOSFET (P-channel metal oxide semiconductor field effect transistors) having a gate with the inverted PWM signal RxD_org applied thereon. The PMOSFET PM acts as the charge switch 100 of FIG. 3 and turns on to couple the high supply voltage $V_{DD}$ to the node N2 when the received PWM signal RxD_org is at the logic high level. The PMOSFET PM turns off when the received PWM signal RxD_org is at the logic low level.

The bottom NMOSFETs NM4, NM5, NM6, and NM7 have gates coupled to an inverted form of the received PWM signal. Such NMOSFETs NM4, NM5, M6, and NM7 are turned on when the received PWM signal is at the logic low level, and are turned off when the received PWM signal is at the logic high level.

The top NMOSFETs NM0, NM1, NM2, and NM3 have gates coupled to a respective one of the control signals Idch<0>, Idch<1>, Idch<2>, and Idch<3>, generated by the tuner 240. Each of such control codes turns on or turns off such a respective one of the NMOSFETs.

The NMOSFETs NM0 and NM4 form a first series, the NMOSFETs NM1 and NM5 form a second series, the NMOSFETs NM2 and NM6 form a third series, and the NMOSFETs NM3 and NM7 form a fourth series. When any of the series of NMOSFETs is turned on, the low supply voltage Vss is coupled to the node N2 for discharging the node with a respective discharge current.

In one embodiment of the present invention, each of the NMOSFETs NM0, NM1, NM2, and NM3 when turned on provides a respective different discharge current as follows:

$$I_{(NM3)} = 2 \times I_{(NM2)} = 4 \times I_{(NM1)} = 8 \times I_{(NM0)}$$

$I_{(NM3)}$ is the discharge current of the NMOSFET NM3 when turned on. $I_{(NM2)}$ is the discharge current of the NMOSFET NM2 when turned on. $I_{(NM1)}$ is the discharge current of the NMOSFET NM1 when turned on. $I_{(NM0)}$ is the discharge current of the NMOSFET NM0 when turned on.

Alternatively, each of the NMOSFETs NM1, NM2, and NM3 may be implemented with NMOSFETs conducting a same level of current coupled in parallel. For example, NMOSFET NM3 may be formed with eight such NMOSFETs coupled in parallel, NMOSFET NM2 may be formed with four such NMOSFETs coupled in parallel, and NMOSFET NM1 may be formed with two such NMOSFETs coupled in parallel. The NMOSFET NM0 would be formed of one such NMOSFET.

The variable capacitor circuit 220 has a variable capacitance that is set by capacitance control signals Cvar<3:0> from the tuner 240. Each of the capacitance control signals Cvar<3:0> determines whether a respective one of the capacitors C3, C2, C1, and C0 is coupled the node N2 and the low supply voltage Vss via a respective one of the switches SW3, SW2, SW1, and SW0.

The capacitors C3, C2, C1, and C0 have binary weighted capacitances as follows:

$$C3 = 2 \times C2 = 4 \times C1 = 8 \times C0$$

C0 is the capacitance of the capacitor C0, C1 is the capacitance of the capacitor C1, C2 is the capacitance of the capacitor C2, and C3 is the capacitance of the capacitor C3. Thus, the total capacitance may be selected from $2^4 = 16$ possible values depending on the capacitance control signals Cvar<3:0>. The capacitors C3, C2, and C1 may also be implemented with unit capacitors having the capacitance C0 coupled in parallel.

The PWM demodulator of FIG. 5 also includes a sampler 230 that latches the voltage at the node N2 clocked by rising edges of received PWM signal RxD_org to generate the sampled data RxD_SMPL, similar to the sampler 130 of FIG. 3. Thus, the sampler 230 is also comprised of a delay flip flop in the example embodiment of FIG. 5. The sampler 230 also generates an inverted sampled data RxD_SMPLB.

Figure 8:
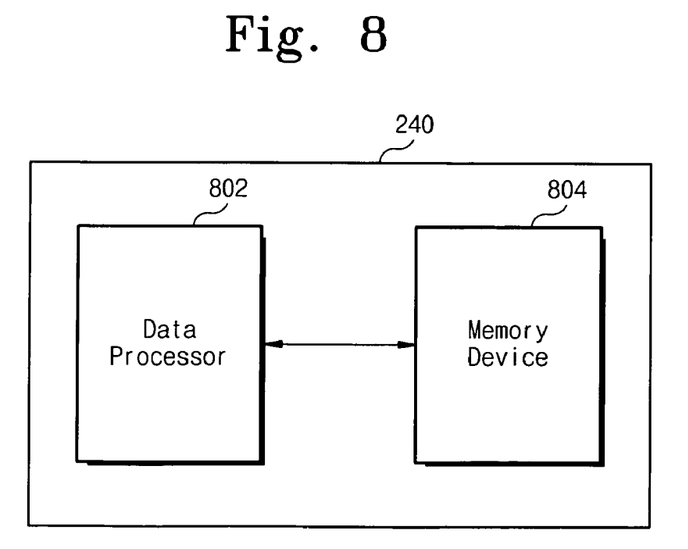
FIG. 8 shows a block diagram of components of the tuner of FIG. 5, according to an example embodiment of the present invention.

The tuner 240 inputs the inverted sampled data RxD_SMPLB and the received PWM signal RxD_org to generate the control signals Idch<3:0> and Cvar<3:0>. Referring to FIGS. 5 and 8, the tuner 240 includes a data processor 802 and a memory device 804 having sequences of instructions (i.e. software) stored thereon. Execution of such sequences of instructions by the data processor 802 causes the data processor 802 to perform the steps of the flow-chart of FIGS. 6A and 6B to be described in more detail later herein, in one embodiment of the present invention.

Thus, the tuner 240 determines a final capacitance at the node N2 generated by the variable capacitor circuit 220 and a final discharge current from the variable discharge circuit 210 during the clock sync period $20T_0$ as illustrated in FIG. 4A for example. After such a tuning operation, the tuner 240 generates a tuning end signal Tune_OK indicating when data may be properly transferred from the reader 702 to an input/output terminal I/O disposed at the side of the core (not shown).

A data holder 250 holds the sampled data RxD_SMPL until the Tune_OK signal is activated by the tuner 240. The Tune_OK signal is activated by the tuner 240 when the tuner 240 has achieved synchronization by determining the final capacitance from the variable capacitor circuit 220 and the final discharge current from the variable discharge circuit 210 resulting in a stable stream of the logic low level [0] in the sampled data RxD_SMPL.

At that point, the data holder transfers the sampled data RxD_SMPL to generate the final signal RxD_fin for the input/output terminal I/O of the core during the clock sync period. Such a stable stream of the logic low level [0] in the sampled data RxD_SMPL is used by the core for its initialization during the clock sync period.

The tuning operation by the tuner 240 is now described in more detail with reference to FIGS. 6A and 6B. When power is supplied to the RFID tag having the PWM demodulator of FIG. 5, the clock sync period begins with initialization when the tuner 240 sets Idch<3:0>=[1111] and Cvar<3:0>=[1000] in response to the first clock of the PWM received signal RxD_org (step S10 in FIG. 6A). Thus, the discharge current from the variable discharge circuit 210 is initially set to the maximum, and the capacitance from the variable capacitor circuit 220 is set to an intermediate value.

Figure 6A:
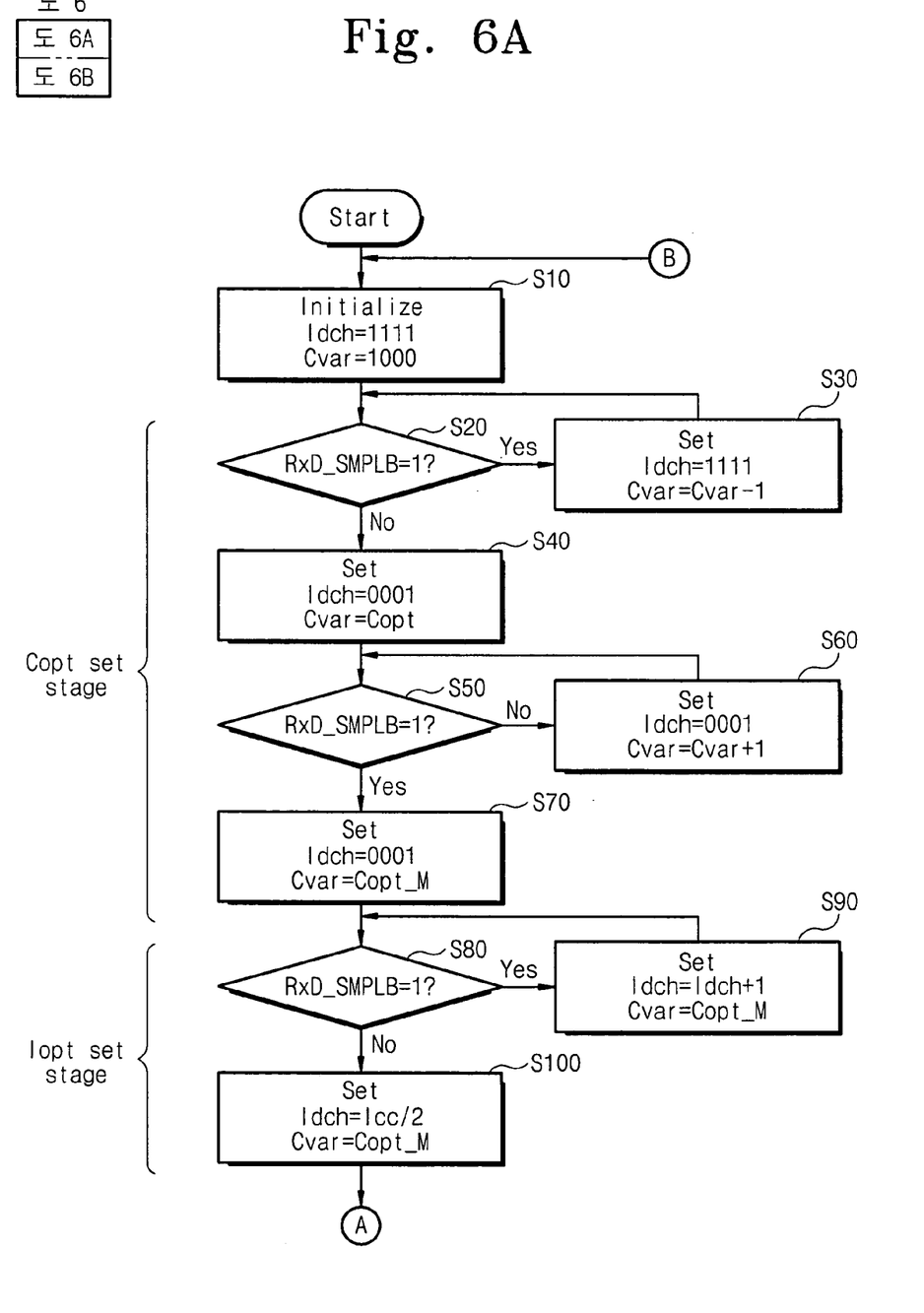
FIGS. 6A and 6B show a flowchart of steps during operation of a tuner in FIG. 5, according to an embodiment of the present invention.

The tuner 240 inputs the inverted sampled data RxD_SMPLB through feedback to determine whether the received PWM signal RxD_org has been properly demodulated into [0] (step S20 of FIG. 6A). If the inverted sampled data RxD_SMPLB is at the logic high level [1], the capacitance generated by the variable capacitor circuit 220 is decreased (step S30 of FIG. 6A) for proper operation even with a large discharge current.

Such steps S20 and S30 are repeated until the inverted sampled data RxD_SMPLB is at the logic low level [0]. At that point, the tuner 240 stores the capacitance control signals Cvar<3:0> corresponding to the current capacitance value as an intermediate capacitance Copt of the variable capacitor circuit 220 (step S40 of FIG. 6A).

In addition, the discharge current is set to a minimum value (Idch<3:0>=[0001]) for selecting between different RF environment modes (step S40 of FIG. 6A). If the inverted sampled data RxD_SMPLB is at the logic high level [1] in step S50, the pulse duration of the logic low level in each cycle of the received PWM signal RxD_org is long enough to enable sufficient discharge even with the minimum discharge current. Such a case corresponds to the second mode MODE_2 in FIG. 4A with the longer clock cycle $T_0'$. In that case, the final capacitance Cvar is set to the current intermediate capacitance Copt_M from step S40, and the discharge current is set to the minimum discharge current (Idch<3:0>=[0001]).

On the other hand, if the inverted sampled data RxD_SMPLB is at the logic low level [0] in step S50, then mode alteration is performed by steps S50 and S60 of FIG. 6A. In that case, a larger capacitance is desired such that the capacitance is increased at step S60, and steps S50 and S60 are repeated until RxD_SMPLB is set to the logic high level [1] in step S50. The final capacitance Cvar is set to the final increased capacitance when RxD_SMPLB is at the logic high level [1] (step S70 of FIG. 6A).

Steps S20, S30, S40, S50, S60, and S70 of FIG. 6A are for determining the final capacitance of the variable capacitor circuit 220 for resulting in a stable series of the logic low level [0] in the sampled data RxD_SMPL. After step S70 in FIG. 6A, the discharge current from the variable discharge circuit 210 has been set to the minimum discharge current rate Idch<3:0>=[0001]. The final capacitance of the variable capacitor circuit 220 is set to the capacitance determined in step S70.

Thereafter, steps S80, S90, and S100 of FIG. 6A are performed for determining an interim discharge current resulting in a stable series of the logic low level [0] in the sampled data RxD_SMPL. To that end, steps S80 and S90 are performed until a threshold discharge current Icc is determined for when the inverted sampled data RxD_SMPLB is transitioned to the logic low level from the logic high level.

After determination of the threshold discharge current Icc, the intermediate discharge current Idch is set to a half of the threshold current Icc (Idch=Icc/2) (step S100 of FIG. 6A). Such a discharge current Idch of Icc/2 enables discharge at the node N2 to be properly carried out for either of the PWM pulse periods (⅛)T0 and (⅜)T0.

Subsequently referring to FIG. 6B, steps S110, S120, S130, and S140 are performed for verifying the interim discharge current Idch of Icc/2 as the final discharge current. In step S110, if the inverted sampled data RxD_SMPLB is not set to the logic high level [1], then the discharge current of Icc/2 is deemed to be improper, and the flow-chart returns to the initialization step S10.

Figure 6B:
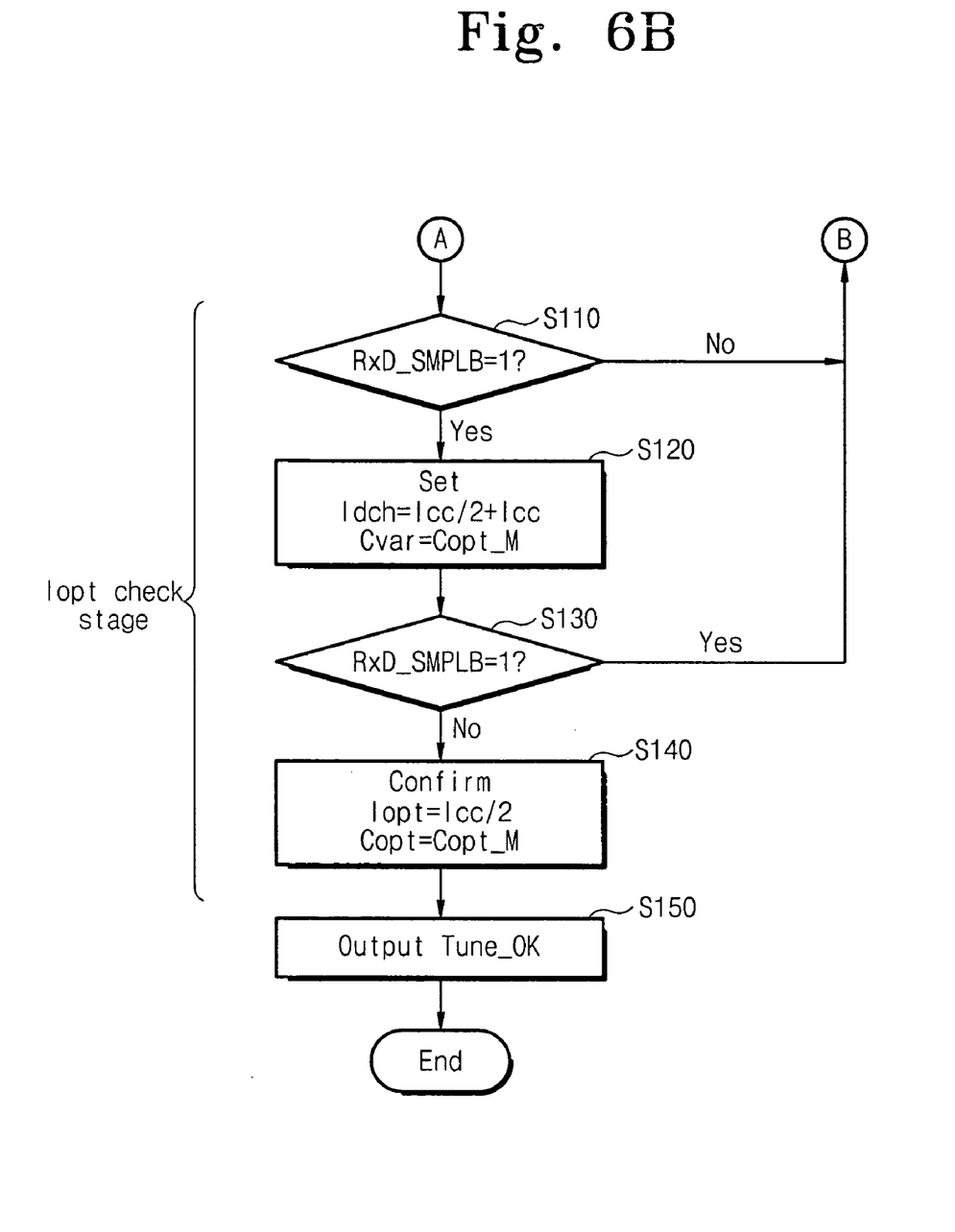

Otherwise in step S110, if the inverted sampled data RxD_SMPLB is set to the logic high level [1], the discharge current Idch is changed to a maximum rate of Icc/2+Icc (step S120 of FIG. 6B). In that case, the inverted sampled data RxD_SMPLB should be set to the logic low level [0] for proper operation. If the inverted sampled data RxD_SMPLB is set to the logic high level [1] in step S130, then the final capacitance Cvar and the discharge current Idch are determined to be improper, and the flow-chart of FIGS. 6A and 6B returns to the initialization step S10

On the other hand, if the inverted sampled data RxD_SMPLB is set to the logic low level [0] in step S130, then the final capacitance Cvar and the intermediate discharge current Idch=Icc/2 are determined to be properly set (step S140 of FIG. 6B). Subsequently, the tuner 240 activates the tuning end signal Tune_OK (step S150 of FIG. 6B) for enabling the data holder 250 to output the sampled data RxD_SMPL to the core. Thereafter, the flowchart of FIGS. 6A and 6B ends.

In this manner, the PWM demodulator of FIG. 3 or 5 adaptively adjust the capacitance and discharge current for high performance of the PWM demodulator in various communication modes in the RF environment. Moreover, such adaptive PWM demodulator operates with high performance even with unpredictable capacitance and discharge current of the individual components from process variations during fabrication of the PWM demodulator for enhancing operational yield.

The foregoing is by way of example only and is not intended to be limiting. For example, any numbers or number of elements described and illustrated herein is by way of example only. In addition, any type of device or any type of material as described or illustrated herein is by way of example only.

The present invention is limited only as defined in the following claims and equivalents thereof.

What is claimed is:
1. A demodulator for processing a PWM (pulse width modulation) signal, the demodulator comprising:
   a variable capacitor;
   a charging unit for charging the variable capacitor when the PWM signal is at a first logic level;
   a discharging unit for discharging the variable capacitor when the PWM signal is at a second logic level;

a sampler for generating a sampled data from a voltage at the variable capacitor; and a tuner for determining a final capacitance of the variable capacitor and a final discharge current of the discharging unit resulting in the sampled data having a desired bit pattern.

2. The demodulator of claim 1, wherein the charging unit includes:

a transistor that is turned on for coupling a high supply voltage to the variable capacitor when the PWM signal is at the first logic level.

3. The demodulator of claim 1, wherein the discharging unit includes:

a plurality of transistors, with a set of the transistors being selected by the tuner to be turned on for coupling a low supply voltage to the variable capacitor when the PWM signal is at the second logic level.

4. The demodulator of claim 1, wherein the variable capacitor includes:

a plurality of capacitors, with a set of the capacitors being selected by the tuner to be coupled to the charging and discharging units.

5. The demodulator of claim 1, wherein the sampler generates the sampled data in sync with the PWM signal.

6. The demodulator of claim 1, further comprising:

a data holder for storing and outputting the sampled data from the sampler when the tuner indicates that sampled data has the desired bit pattern.

7. The demodulator of claim 1, wherein the tuner adjusts a capacitance of the variable capacitor and a discharge current of the discharging unit until the sampled data has the desired bit pattern during a clock synchronization period.

8. The demodulator of claim 1, wherein the tuner includes:

a data processor; and a memory device having sequences of instructions stored thereon, wherein execution of the sequences of instructions by the data processor causes the data processor to perform the steps of:

determining the final capacitance with a maximum discharge current and a minimum discharge current;

determining an interim discharge current that is one half of a threshold discharge current when the sampled data reaches an undesired bit pattern; and verifying the interim discharge current as the final discharge current.

9. A smart card comprising:

a contact-less interface for receiving a PWM (pulse width modulation) signal transmitted from a reader; and a demodulator for processing the PWM signal, the demodulator including:

a variable capacitor;

a charging unit for charging the variable capacitor when the PWM signal is at a first logic level;

a discharging unit for discharging the variable capacitor when the PWM signal is at a second logic level;

a sampler for generating a sampled data from a voltage at the variable capacitor; and a tuner for determining a final capacitance of the variable capacitor and a final discharge current of the discharging unit resulting in the sampled data having a desired bit pattern.

10. The smart card of claim 9, wherein the charging unit includes:

a transistor that is turned on for coupling a high supply voltage to the variable capacitor when the PWM signal is at the first logic level.

11. The smart card of claim 9, wherein the discharging unit includes:

a plurality of transistors, with a set of the transistors being selected by the tuner to be turned on for coupling a low supply voltage to the variable capacitor when the PWM signal is at the second logic level.

12. The smart card of claim 9, wherein the variable capacitor includes:

a plurality of capacitors, with a set of the capacitors being selected by the tuner to be coupled to the charging and discharging units.

13. The smart card of claim 9, wherein the sampler generates the sampled data in sync with the PWM signal.

14. The smart card of claim 9, wherein the demodulator further includes:

a data holder for storing and outputting the sampled data from the sampler when the tuner indicates that sampled data has the desired bit pattern.

15. The smart card of claim 9, wherein the tuner adjusts a capacitance of the variable capacitor and a discharge current of the discharging unit until the sampled data has the desired bit pattern during a clock synchronization period.

16. The smart card of claim 9, wherein the tuner includes:

a data processor; and a memory device having sequences of instructions stored thereon, wherein execution of the sequences of instructions by the data processor causes the data processor to perform the steps of:

determining the final capacitance with a maximum discharge current and a minimum discharge current;

determining an interim discharge current that is one half of a threshold discharge current when the sampled data reaches an undesired bit pattern; and verifying the interim discharge current as the final discharge current.

17. A method of demodulating a PWM (pulse width modulation) signal, comprising:

charging a variable capacitor when the PWM signal is at a first logic level;

discharging the variable capacitor when the PWM signal is at a second logic level;

generating a sampled data from a comparison of a voltage at the variable capacitor with a reference voltage; and determining a final capacitance of the variable capacitor and a final discharge current for discharging the variable capacitor that results in the sampled data having a desired bit pattern.

18. The method of claim 17, further comprising:

selecting a set of a plurality of transistors to be turned on for discharging the variable capacitor for determining the final discharge current.

19. The method of claim 17, further comprising:

selecting a set of plurality of capacitors to be charged and discharged for determining the final capacitance.

20. The method of claim 17, wherein the step of determining the final capacitance and the final discharge current includes the steps of:

determining the final capacitance with a maximum discharge current and a minimum discharge current;

determining an interim discharge current that is one half of a threshold discharge current when the sampled data reaches an undesired bit pattern; and verifying the interim discharge current as the final discharge current.

* * * * *